(12) United States Patent
Shiobara et al.

(10) Patent No.: US 7,779,777 B2
(45) Date of Patent: Aug. 24, 2010

(54) SUBSTRATE PROCESSING APPARATUS AND METHOD

(75) Inventors: Eishi Shiobara, Yokohama (JP); Hirokazu Kato, Zushi (JP); Seiro Miyoshi, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/466,525

(22) Filed: May 15, 2009

(65) Prior Publication Data

US 2009/0226624 A1    Sep. 10, 2009

Related U.S. Application Data

(62) Division of application No. 11/798,132, filed on May 10, 2007, now abandoned.

(30) Foreign Application Priority Data

May 16, 2006   (JP)   ............................. 2006-136613

(51) Int. Cl.
*B05B 15/02*   (2006.01)
*B05B 3/00*   (2006.01)
*B05B 1/28*   (2006.01)
*B05B 13/02*   (2006.01)

(52) U.S. Cl. .................. 118/302; 118/300; 118/321; 118/323; 118/319; 118/320; 239/106; 239/112; 239/113; 239/120; 239/121

(58) Field of Classification Search .................. 118/52, 118/612, 56, 319, 320, 300, 302, 321, 323; 239/104, 106, 112, 113, 120, 121; 134/153, 134/198, 902; 427/424, 425, 240; 396/604, 396/611, 627
See application file for complete search history.

(56) References Cited

U.S. PATENT DOCUMENTS

| 5,725,664 A | * | 3/1998 | Nanbu et al. ................ 118/52 |
| 5,779,796 A | | 7/1998 | Tomoeda et al. |
| 6,270,576 B1 | | 8/2001 | Araki et al. |

FOREIGN PATENT DOCUMENTS

| JP | 10-177940 | 6/1998 |
| JP | 10-209024 | 8/1998 |
| JP | 2003-112083 | 4/2003 |

* cited by examiner

*Primary Examiner*—Yewebdar T Tadesse
(74) *Attorney, Agent, or Firm*—Finnegan, Henderson, Farabow, Garrett & Dunner, L.L.P.

(57) ABSTRACT

A substrate-processing apparatus includes a sample table which mounts thereon a to-be-processed substrate, a first line which supplies a chemical solution, a second line which supplies a cleaning liquid, a three-way valve connected to the first and second lines and configured to select one of the first and second lines, a filter provided across the first line upstream of the three-way valve, and configured to eliminate a foreign material from the chemical solution, and a nozzle provided downstream of the three-way valve and configured to discharge the chemical solution or the cleaning liquid when the first or second line is selected via the three-way valve. The three-way valve selects the first line when the substrate is coated with the chemical solution, and selects the second line in other cases.

6 Claims, 3 Drawing Sheets

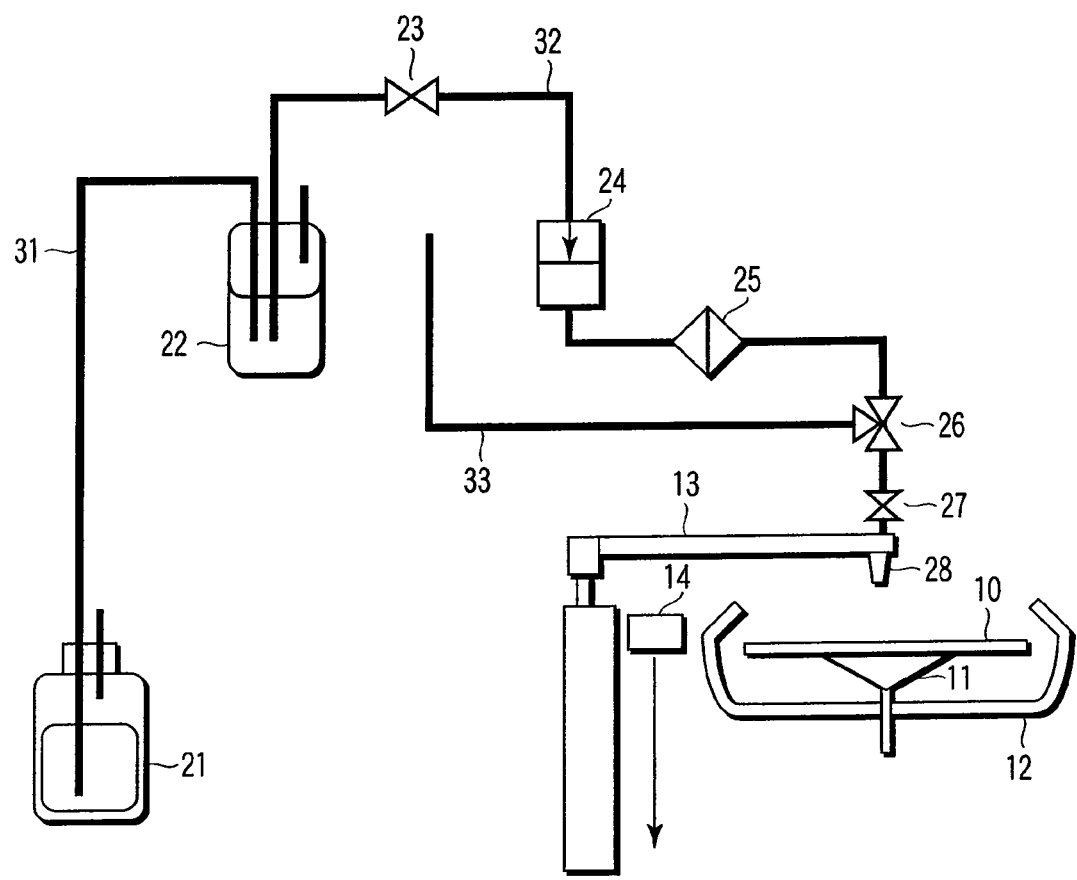
F I G. 1

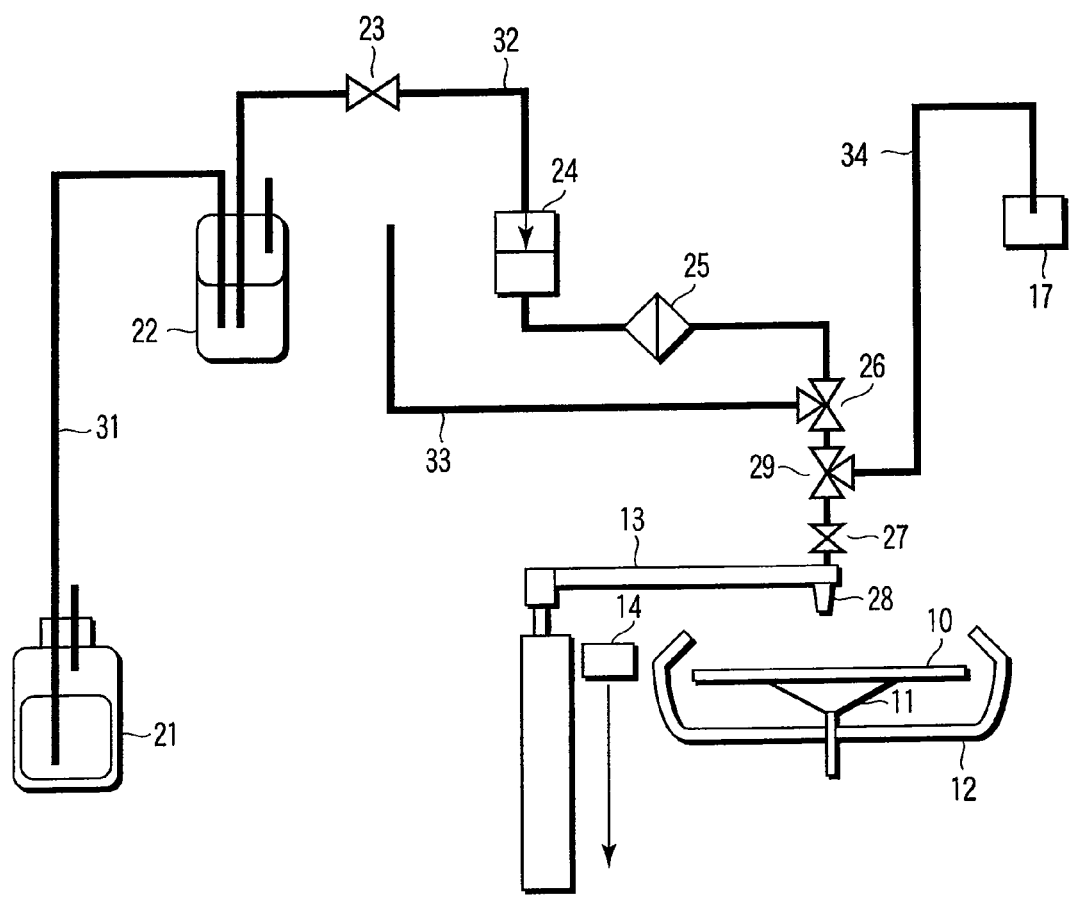
F I G. 2

SUBSTRATE PROCESSING APPARATUS AND METHOD

CROSS-REFERENCE TO RELATED APPLICATIONS

This application is a divisional of U.S. application Ser. No. 11/798,132, filed May 10, 2007, now abandoned, the entire contents of which are incorporated herein by reference. In addition, this application is based upon and claims the benefit of priority from prior Japanese Patent Application No. 2006-136613, filed May 16, 2006, the entire contents of which are incorporated herein by reference.

BACKGROUND OF THE INVENTION

1. Field of the Invention

The present invention relates to a substrate processing apparatus and method to form the coating film on a to-be-processed substrate by applying a chemical solution.

2. Description of the Related Art

In lithography employed for manufacturing a semiconductor device, a semiconductor wafer with a to-be-processed film thereon is coated with a chemical solution such as a resist, which serves as a resist film. Selected portions of the resist film are exposed to light. After that, the resist film is developed to obtain a resist pattern. Using this patterned resist, the to-be-processed film is processed, whereby a desired pattern is formed on the semiconductor wafer.

A chemical solution such as a resist is guided onto a semiconductor wafer via a solution supply line (pipe) and dripped through a discharge nozzle. Depending upon the type of chemical solution, the number of particles of the solution is increased in the pipe. Most of the particles are eliminated by a final filter provided across the solution supply line. However, particles intermittently occur in the solution accumulated between the final filter and discharge nozzle, and the particles occurring at the secondary side of the final filter may well become coating defects.

Further, the supply of the solution is stopped after coating of one wafer and before coating of another wafer. At this time, the solvent in the solution vaporizes at the tip of the nozzle, and particles occur in the resultant condensed solution. This causes defects in coating.

In accordance with the development of pattern microfabrication, multi-layer resist also have come to be used in view of resolution. In a process using a multi-layer resist, a lower resist layer is formed on a to-be-processed film provided on a semiconductor wafer. Subsequently, an intermediate material as a sol-gel liquid, such as SOG, is coated and heated to form an intermediate layer. After that, a resist solution is coated to form an upper resist layer. The coating materials of the intermediate layer and upper resist layer are discharged through a nozzle having a tapered tip (JP-A 2003-112083 [KOKAI]).

However, in the case of coatings made of a sol-gel material for an intermediate layer represented by SOG, coating defects that are considered to result from gel in the solution are liable to occur. The inventors of the present invention have conducted research and found that gel growth occur at the condensed surface, i.e., gas-liquid boundary, of a sol-gel solution at the tip of a solution discharge nozzle.

Thus, when a chemical solution is dripped through a nozzle onto the surface of a to-be-processed substrate, the particles occurring between a final filter and nozzle, and/or the particles occurring at the tip of the nozzle may cause coating defects. Further, in the case of using a chemical solution in a process utilizing a multi-layer resist, gelling easily occurs at the tip of the nozzle and causes coating defects to occur.

BRIEF SUMMARY OF THE INVENTION

In accordance with a first aspect of the invention, there is provided a substrate-processing apparatus comprising: a sample table which mounts thereon a to-be-processed substrate; a first line which supplies a chemical solution; a second line which supplies a cleaning liquid; a three-way valve connected to the first and second lines and configured to select one of the first and second lines, the three-way valve selecting the first line when the substrate is coated with the chemical solution, and selecting the second line in other cases; a filter provided across the first line upstream of the three-way valve, and configured to eliminate a foreign material from the chemical solution; and a nozzle provided downstream of the three-way valve and configured to discharge the chemical solution or the cleaning liquid when the first or second line is selected via the three-way valve.

In accordance with a second aspect of the invention, there is provided a substrate-processing apparatus comprising: a sample table which mounts thereon a to-be-processed substrate; a first line which supplies a chemical solution; a second line which supplies a cleaning liquid; a first three-way valve connected to the first and second lines and configured to select one of the first and second lines, the three-way valve selecting the first line when the substrate is coated with the chemical solution, selecting the second line after the chemical solution is supplied, and selecting the first line before the chemical solution is again supplied; a filter provided across the first line upstream of the three-way valve, and configured to eliminate a foreign material from the chemical solution; a nozzle provided downstream of the three-way valve and configured to discharge the chemical solution or the cleaning liquid when the first or second line is selected via the three-way valve; and a second three-way valve interposed between the first three-way valve and the nozzle and configured to switch supply of the chemical solution or the cleaning liquid to a nozzle side or to a third line side, the second three-way valve switching the supply to the nozzle side when the chemical solution is supplied onto the substrate, thereby causing the nozzle to discharge the chemical solution onto the substrate, the second three-way valve switching the supply to the nozzle side after the chemical solution is supplied, thereby filling a portion ranging from the first three-way valve to the nozzle with the cleaning liquid, the second three-way valve switching the supply to the third line side before the chemical solution is again supplied, thereby discharging, through the third line, the chemical solution contained in a portion ranging from the filter to the first three-way valve.

In accordance with a third aspect of the invention, there is provided a substrate-processing apparatus comprising: a line which supplies a chemical solution onto a to-be-processed substrate; and a nozzle connected to a tip of the line and configured to discharge the chemical solution onto the substrate, the nozzle having an inner diameter set smaller at a portion of the nozzle located slightly upstream of a distal end thereof than at the distal end, which facilitates sucking back of the chemical solution performed after supply of the chemical solution is stopped.

In accordance with a fourth aspect of the invention, there is provided a method for processing a substrate comprising: using a substrate-processing apparatus provided with a first line which supplies a chemical solution, a second line which supplies a cleaning liquid, a three-way valve which selects one of the first and second lines, and a nozzle which discharges the chemical solution or the cleaning liquid when the first or second line is selected via the three-way valve; selecting the first line via the three-way valve when coating the substrate with the chemical solution, thereby causing the nozzle to discharge the chemical solution onto the substrate; and selecting the second line via the three-way valve in other cases, thereby filling a portion ranging from the three-way valve to the nozzle with the cleaning liquid.

BRIEF DESCRIPTION OF THE SEVERAL VIEWS OF THE DRAWING

FIG. 1 is a schematic view illustrating a substrate-processing apparatus according to a first embodiment;
FIG. 2 is a schematic view illustrating a substrate-processing apparatus according to a second embodiment.

DETAILED DESCRIPTION OF THE INVENTION

Figure 3:
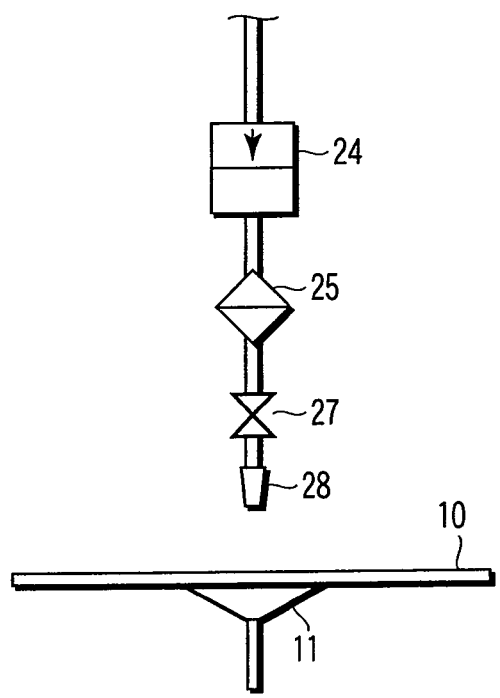
FIG. 3 is a schematic view illustrating a substrate-processing apparatus according to a third embodiment.

Embodiments of the invention will be described in detail referring to the accompanying drawings.

FIRST EMBODIMENT

FIG. 1 is a schematic view illustrating a substrate-processing apparatus according to a first embodiment.

In FIG. 1, reference number 10 denotes a to-be-processed substrate such as a semiconductor wafer, reference number 11 a rotatable sample table, reference number 12 a cover, reference number 13 a nozzle movement arm, reference number 14 a drain, reference number 21 a solution bottle for containing a chemical solution such as a resist, reference number 22 a buffer tank for receiving the solution, reference number 23 a valve, reference 24 a pump, reference 25 a final filter, reference 26 a first three-way valve, reference number 27 a valve, reference number 28 a nozzle, and reference numbers 31, 32 and 33 pipes.

The substrate 10 is placed on the sample table 11 and is made rotatable about its axis. The cover 12 surrounds the sides and bottom of the substrate 10 to prevent a solution, supplied from the nozzle 28 onto the substrate 10, from diffusing to the outside.

The solution bottle 21 is connected to the buffer tank 22 via the pipe 31. The valve 23, pump 24, final filter 25, first three-way valve 26 and valve 27 are provided across the pipe 32 in order from the buffer tank 22 side. Films other than the final filter 25 are provided across the pipes 31 and 32 although they are not shown.

The first three-way valve 26 is connected to the pipe 32 serving as a solution supply line (first line), and also to the pipe 33 serving as a thinner line (second line). The first three-way valve 26 selects one of the chemical solution supplied via the final filter 25, and the thinner supplied from the thinner line, and outputs it to the nozzle 28.

The nozzle 28 is attached to the nozzle movement arm 13, and is movable between the center of the substrate 10 and the nozzle standby position on the drain 14 in accordance with the movement of the arm 13.

A description will now be given of a method for processing the substrate.

Firstly, when supplying the chemical solution onto the substrate 10, the sample table 11 is rotated to rotate the substrate 10, and the nozzle movement arm 13 is driven to move the nozzle 28 to above the center of the substrate 10. Subsequently, the three-way valve 26 is switched to the chemical solution side and the valves 23 and 27 are opened to draw the chemical solution by the pump 24 from the buffer tank 22 to the nozzle 28 via the filter 25, whereby the chemical solution is discharged onto the substrate 10 through the nozzle 28.

After finishing the supply of the chemical solution, the valve 27 is closed and the nozzle 28 is returned to the standby position by the nozzle movement arm 13. Further, the three-way valve 26 is switched to the thinner line side, and the valve 27 is opened, whereby a thinner is supplied from the thinner supply line to the tip of the nozzle 28 to clean the same. Since at this time, the nozzle 28 is at the standby position, the chemical solution guided from the three-way valve 26 to the tip of the nozzle 28 during the switching of the three-way valve 26, and the thinner used to purge the chemical solution left on the tip of the nozzle 28 are exhausted to the drain 14 located below the nozzle standby position, and then to an exhaust tank (not shown). It is desirable to set the amount of the thinner (cleaning liquid) to a value that enables the chemical solution left on the tip of the nozzle to be sufficiently cleaned. The thinner may be sucked back after it purges the chemical solution.

When the supply of the chemical solution onto the substrate 10 is resumed after it is once finished, the three-way valve 26 is again switched to the chemical solution side to newly supply the chemical solution to purge the thinner and chemical solution left between the three-way valve 26 and the tip of the nozzle 28, and to discharge them to the drain 14 located below the nozzle standby position, as in the purging process using the thinner. After the remaining chemical solution and thinner have been completely replaced with the newly supplied chemical solution, the nozzle movement arm 13 is driven to set the nozzle 28 to above the center of the substrate 10, whereby the supply of chemical solution onto the substrate 10 is resumed.

The time required from the discharge of the chemical solution onto the substrate 10 to the purge of the solution from the substrate 10 may be set, based on a preset time with which particles of coating occur in the chemical solution. Further, when the supply of the chemical solution onto the substrate 10 is resumed through the solution supply line purged by the thinner (cleaning liquid), it is desirable that the purged line is again purged by the chemical solution. During re-purging by the chemical solution, the cleaning liquid may be sucked back to the thinner supply line.

As described above, in the first embodiment, after the chemical solution is discharged from the nozzle 28 onto the substrate 10, the three-way valve 26 is switched to enable the thinner to purge the chemical solution left between the three-way valve 26 and the nozzle 28. Further, by switching the three-way valve 26 before the supply of the chemical solution onto the substrate 10 is resumed, the thinner and chemical solution left between the three-way valve 26 and the nozzle 28 are purged by newly supplying the chemical solution. This prevents occurrence of particles at the secondary side of the final filter 25, thereby suppressing occurrence of coating defects.

As described above, the three-way valve 26 for selecting one of the first line for supplying the chemical solution and the second line for supplying the cleaning liquid (thinner) enables the cleaning liquid to be supplied to the tip of the nozzle 28 during the time other than the coating of the chemical solution. As a result, occurrence of particles at the secondary side of the final filter 25 can be prevented, thereby suppressing occurrence of coating defects.

SECOND EMBODIMENT

FIG. 2 is a schematic view illustrating a substrate-processing apparatus according to a second embodiment. In FIG. 2, elements similar to those shown in FIG. 1 are denoted by corresponding reference numbers, and are not described in detail.

The second embodiment is similar to the first embodiment of FIG. 1 except that the former also incorporates a second three-way valve 29 interposed between the three-way valve 26 and valve 27. The second three-way valve 29 is connected to a pipe 34 serving as a dummy dedicated line. The second three-way valve 29 outputs, to the nozzle 28 or dummy dedicated line 34, the liquid supplied from the first three-way valve 26 located upstream of the valve 29.

In the second embodiment, the process ranging from the supply of the chemical solution onto the substrate 10 to the purge of the chemical solution by the thinner is similar to that of the first embodiment. Note that in the purged state, the nozzle 28 is at the nozzle standby position, and the thinner is left between the first three-way valve 26 and the tip of the nozzle 28.

In addition, in the second embodiment, before the supply of the chemical solution is resumed, the first three-way valve 26 is switched to the chemical solution line, and the second three-way valve 29 is switched to the dummy dedicated line, thereby discharging the thinner downstream of the first three-way valve 26 to a drain 17. As a result, the chemical solution left between the filter 25 and the first three-way valve 26 during purging by the thinner can be discharged to the drain 17 without passing it through the nozzle 28. Namely, the particles occurring between the secondary side of the filter and the first three-way valve 26 can be discharged to the drain 17.

The second three-way valve 29 is switched to the nozzle side immediately before the supply of the chemical solution is resumed, thereby enabling purging using the chemical solution. Namely, the chemical solution is supplied to discharge the thinner left between the second three-way valve 29 and the tip of the nozzle 28 to the drain 14 located below the nozzle standby position, and the supplied chemical solution itself is discharged to the drain 14. After the thinner is completely replaced with the chemical solution, the nozzle movement arm 13 is driven to set the nozzle 28 to above the center of the substrate 10, thereby resuming the supply of the chemical solution to the substrate 10.

As described above, since the second embodiment incorporates the second three-way valve 29 and dummy dedicated line in addition to the elements employed in the first embodiment, the chemical solution left between the filter 25 and the first three-way valve 26 can be discharged to the drain 17 during purging by the thinner. Accordingly, occurrence of particles at the secondary side of the final filter 25 can be more reliably prevented, and occurrence of coating defects can be further suppressed.

THIRD EMBODIMENT

Figure 4:
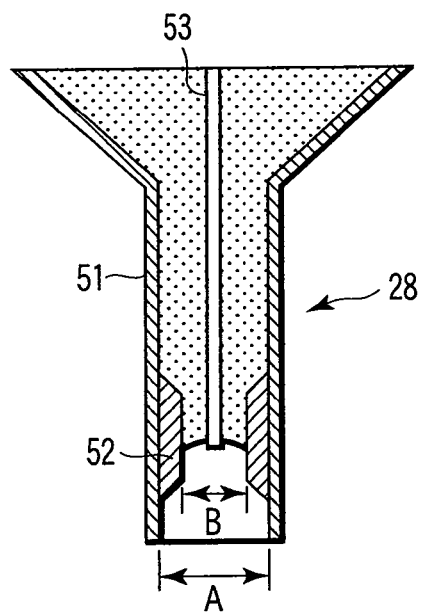
FIG. 4 is a sectional view illustrating an essential part of the substrate-processing apparatus according to the third embodiment.

FIGS. 3 and 4 are views useful in explaining a substrate-processing apparatus according to a third embodiment. FIG. 3 is a schematic view of the substrate-processing apparatus, and FIG. 4 is a sectional view illustrating an essential part of the substrate-processing apparatus.

The third embodiment is characterized by the shape of the nozzle 28. Namely, for the purpose of sucking back the chemical solution left after stopping the supply of the chemical solution, the nozzle 28 is formed to have a smaller inner diameter at a portion thereof located upstream of its distal end, than at the distal end. More specifically, the nozzle 28 includes a tapered portion 51 that has a cylindrical tip portion linearly extending several tens millimeters from the distal end of the nozzle. An annular member 52 is fitted in the linear tip portion 51 near the distal end.

As a result, the tip portion of the nozzle 28 has an inner diameter A of 3 mmφ at the distal end, and an inner diameter B of 1 mmφ over the length from 3 mm to 5 mm from the distal end. Thus, the nozzle inner diameter is 1 mmφ at the gas-liquid boundary of the chemical solution. The nozzle 28 contains a thin tube 53 for sucking the chemical solution at the narrowed inner portion. The tube 53 extends along the axis of the nozzle 28, and has an end located near the annular member 52 and the other end opening to the outside of the nozzle 28.

The solution supply line may be similar to that employed in the first or second embodiment. Further, the third embodiment may incorporate a thinner line, dummy dedicated line, etc., as in the first and second embodiments.

A description will be given of a method for processing a substrate using the apparatus according to the third embodiment.

A sol-gel material, such as SOG, used as the chemical solution was discharged onto the to-be-processed substrate 10 through the nozzle 28 with an inner diameter of 3 mmφ, then dried by spinning of 1500 rmp, and heated for 90 seconds at 300° C., thereby forming an intermediate film. Subsequently, the chemical solution was sucked back to the position 4 mm away from the nozzle tip. After that, a dummy discharge of 1 cc was executed in units of three hours, and film coating was carried out, one day after, in the same method as the above. The resultant substrate was subjected to a defect examination, and found to be good.

To retreat the chemical solution from the tip of the nozzle into the nozzle, it may be slightly sucked back. Further, the chemical solution can be more reliably retreated to a preset suck-back position if it is sucked back through the thin tube 53.

A straight nozzle, which was not reduced in diameter at the solution retreat position, was prepared as a comparative nozzle, and coating was produced and examined in the same way as the above. From this coating, a number of defects were detected.

As described above, in the third embodiment, after the chemical solution is discharged onto the substrate 10, the surface (i.e., gas-liquid boundary) of the chemical solution is retreated to a preset position in the nozzle 28 by sucking back the solution from the tip of the nozzle. Further, the inner diameter of the portion, to which the surface of the chemical solution is retreated, is set smaller than that of the distal end. Accordingly, the area of the gas-liquid boundary of the sol-gel material in the standby state before discharge can be reduced, thereby reducing the number of coating defects due to occurrence of gel at the tip of the nozzle.

In other words, the nozzle 28 is formed to have a smaller inner diameter at a portion thereof located upstream of its distal end, than at the distal end, which enables the area of the chemical solution that contacts the air to be reduced when the chemical solution is sucked back after its supply is stopped. As a result, occurrence of particles at the tip of the nozzle can be suppressed.

(Modification)

The invention is not limited to the above-described embodiments. For example, in the embodiments, a resist is used as a chemical solution. However, various chemical solutions other than this can be used. Further, it is a matter of course that solutions other than the thinner can be used as cleaning liquids.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate-processing apparatus comprising:
    a sample table which mounts thereon a to-be-processed substrate;
    a first line which supplies a chemical solution;
    a second line which supplies a cleaning liquid;
    a first three-way valve connected to the first and second lines and configured to select one of the first and second lines, the first three-way valve selecting the first line when the substrate is coated with the chemical solution, selecting the second line after the chemical solution is supplied, and selecting the first line before the chemical solution is again supplied;
    a filter provided across the first line upstream of the first three-way valve, and configured to eliminate a foreign material from the chemical solution;
    a nozzle provided downstream of the first three-way valve and configured to discharge the chemical solution or the cleaning liquid when the first or second line is selected via the first three-way valve; and
    a second three-way valve interposed between the first three-way valve and the nozzle and configured to switch supply of the chemical solution or the cleaning liquid to a nozzle side or to a third line side, the second three-way valve switching the supply to the nozzle side when the chemical solution is supplied onto the substrate, thereby causing the nozzle to discharge the chemical solution onto the substrate, the second three-way valve switching the supply to the nozzle side after the chemical solution is supplied, thereby filling a portion ranging from the first three-way valve to the nozzle with the cleaning liquid, the second three-way valve switching the supply to the third line side before the chemical solution is again supplied, thereby discharging, through a third line, the chemical solution contained in a portion ranging from the filter to the first three-way valve.

2. The apparatus according to claim 1, wherein the second three-way valve switches the supply to the nozzle side immediately before the chemical solution is again supplied, thereby purging, using the chemical solution, the cleaning liquid contained in a portion ranging from the second three-way valve to the nozzle.

3. The apparatus according to claim 1, wherein the sample table is rotatable.

4. The apparatus according to claim 1, wherein the nozzle is movable between a position corresponding to a center of the substrate and a standby position outside the substrate.

5. The apparatus according to claim 4, wherein the nozzle is cleaned at the standby position by the cleaning liquid supplied, the chemical solution at a tip of the nozzle being purged by the cleaning liquid.

6. The apparatus according to claim 4, further comprising:
    a first drain from which the chemical solution or cleaning liquid discharged from the nozzle, set at the standby position, flows out; and
    a second drain from which the chemical solution led out from the third line flows out.

* * * * *